United States Patent [19]

Friesen

[11] Patent Number: 5,044,966

[45] Date of Patent: Sep. 3, 1991

[54] ELECTRICAL PANEL FOR PHYSICALLY SUPPORTING AND ELECTRICALLY CONNECTING ELECTRICAL COMPONENTS

[76] Inventor: Peter Friesen, R. R. #1, Box 314, Group 24, Winkler, Manitoba, Canada, R0G 2X0

[21] Appl. No.: 355,749

[22] Filed: May 23, 1989

[51] Int. Cl.⁵ .............................................. H01R 9/09
[52] U.S. Cl. .................... 439/78; 174/117 R; 361/400; 361/417; 439/45; 439/85
[58] Field of Search ............. 439/78, 85, 45, 606, 439/714, 722, 784; 174/117 PC; 361/400, 417

[56] References Cited

U.S. PATENT DOCUMENTS

| | | | |
|---|---|---|---|
| 2,883,447 | 4/1959 | Dahl | 174/117 PC |
| 2,918,287 | 12/1959 | Rosenblum et al. | 273/156 |
| 2,997,521 | 8/1961 | Dahlgren | 174/68.5 |
| 3,072,874 | 1/1963 | Roney | 339/17 |
| 3,268,653 | 8/1966 | McNutt | 439/85 |
| 3,516,156 | 6/1970 | Sternako | 439/85 |
| 3,875,479 | 4/1975 | Jaggar | 439/78 |
| 3,923,360 | 12/1975 | Rougon et al. | 439/85 |
| 3,955,124 | 5/1976 | Jones | 339/170 |
| 4,095,866 | 6/1978 | Merrill | 439/85 |
| 4,465,727 | 8/1984 | Fujita et al. | 439/85 |
| 4,700,214 | 10/1987 | Johnson | 357/68 |
| 4,781,600 | 11/1988 | Sugiyama et al. | 439/45 |
| 4,846,705 | 7/1989 | Brunnenmeyer | 439/78 |

*Primary Examiner*—Paula A. Bradley
*Attorney, Agent, or Firm*—Adrian D. Battison; Stanley G. Ade; Murray E. Thrift

[57] ABSTRACT

An electrical panel for particularly supporting and supplying electrical connections for a plurality of electrical components comprises a sandwich formed by a central conducting layer computer design to form a plurality of conducting paths which are laser cut from a sheet of cooper and a pair of covering plastic layers of insulating material. Mechanical anchoring points extend through the sandwich missing the conducting paths into an optional supporting steel sheet. Electrical connecting points comprise screw threaded pins which engage into female screw threads formed in the front insulating layer and into the conducting layer.

20 Claims, 1 Drawing Sheet

5,044,966

ELECTRICAL PANEL FOR PHYSICALLY SUPPORTING AND ELECTRICALLY CONNECTING ELECTRICAL COMPONENTS

BACKGROUND OF THE INVENTION

This invention relates to an electrical panel for physically supporting and supplying electrical connection for a plurality of electrical components.

Electronics components have in recent years been mounted upon circuit boards manufactured often by photographic techniques in which the conductive paths for connecting the electronics components are formed by patterned lines laying upon the circuit board. Various advanced computer techniques have been developed for generating these patterns so that the circuit board can be custom designed for a particular application rapidly and manufactured from the pattern so formed. Electronics components generally however operate upon very low voltages and carry very low currents and hence the manufacture of the circuit board can be carried out by etching techniques or deposit techniques since the amount of metallic material necessary for conducting the low currents is relatively small.

In contrast the electrical components necessary for various machines including contactors, relays, breakers and the like often must carry voltages generally in excess of 100 volts and often as much as 600 volts. Accordingly the currents flowing through the connectors are correspondingly large reaching values of many amps. Attempts have been made to manufacture circuit boards for use with electrical components in a similar manner used with the electronics components of low current values. This has been attempted by various depositing techniques using low melting point metallic materials but these techniques have not been successful and have not been widely adopted.

The general technique therefore for the mounting and electrical connection of electrical components involves complex wiring harnesses formed by individual wires which have to be assembled, inserted onto the machine and attached to the various components. This requirement is highly inefficient and hence expensive in labor costs, significantly increasing the cost of the basic machine.

It is one object of the present invention, therefore, to provide an improved panel arrangement for mechanically supporting and electrically connecting various electrical components of an electrical system.

According to the first aspect of the invention, therefore there is provided an electrical panel for physically supporting and supplying electrical connections for a plurality of electrical components comprising a layer of a conductive material formed into a plurality of conductive paths, a first non-conductive material covering a forward side of said layer, a second non-conductive material covering a rearward side of said layer so that the layer is enclosed and sandwiched between said materials, means providing structural strength for said panel sufficient to support said panel and said components attached thereto, a first plurality of holes formed in said first non-conductive material communicating with electrical connecting points on said conductive paths of said layer for allowing electrical connection thereto and a second plurality of holes formed in said first non-conductive material communicating with positions on said panel spaced from said conductive paths to provide mechanical connection of said components to said panel.

According to a second aspect of the invention there is provided a method of supporting and connecting electrical components comprising generating a pattern of electrical connection paths having electrical connection points thereon and mechanical connection points separate from the paths, forming a layer of a conductive material into said paths, embedding said layer in a non-conductive material forming a front layer of said non-conductive material and a rear layer of said non-conductive material, forming a first plurality of holes in said front layer to connect with said electrical connection points, forming a second plurality of holes in said front layer to connect with said mechanical connecting points between said electrical connection paths, and providing structural strength for said panels sufficient such that said mechanical connecting points support said components.

SUMMARY OF THE INVENTION

With the foregoing in view, and other advantages as will become apparent to those skilled in the art to which this invention relates as this specification proceeds, the invention is herein described by reference to the accompanying drawings forming a part hereof, which includes a description of the best mode known to the applicant and of the preferred typical embodiment of the principles of the present invention, in which:

DESCRIPTION OF THE DRAWINGS

In the drawings like characters of reference indicate corresponding parts in the different figures.

DETAILED DESCRIPTION

Figure 1:
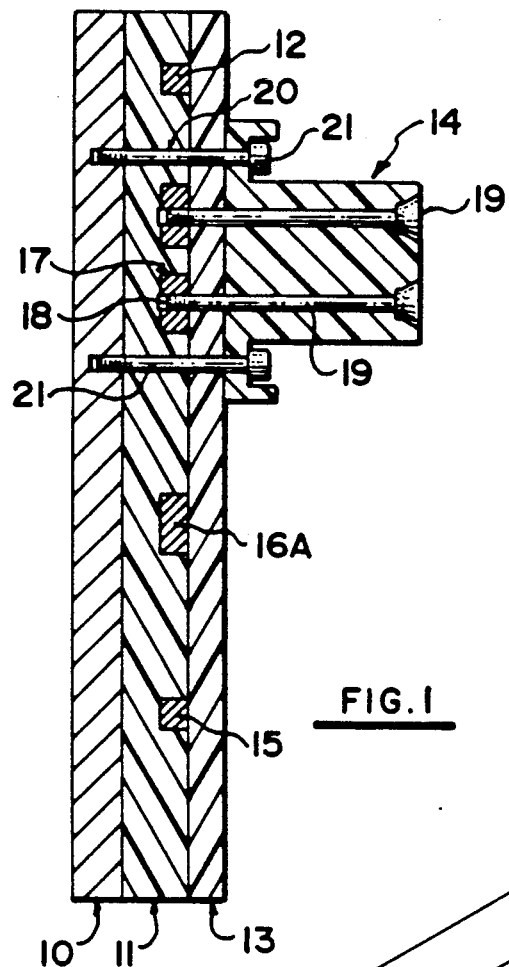
FIG. 1 is a cross sectional view of an electrical circuit panel according to the invention.
Figure 2:
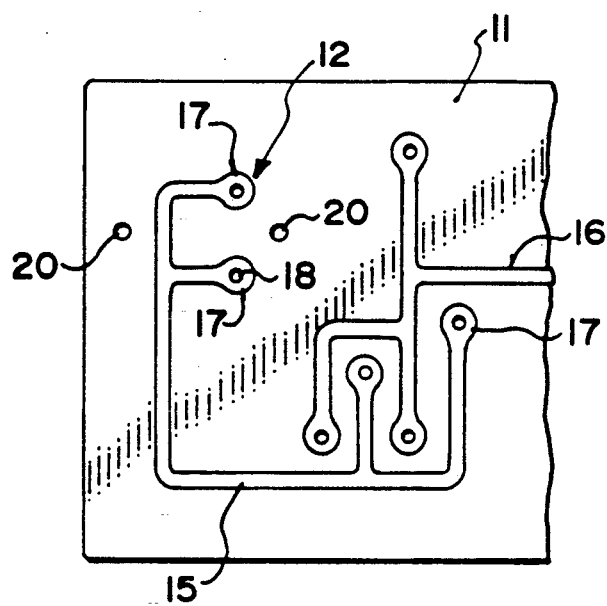
FIG. 2 is a cross sectional view of a panel according to the invention taken along the line joining the inner and outer non-conducting layers.

The panel of FIG. 1 comprises a rear structurally supporting steel plate 10, a rear insulating plastics layer 11, an intermediate conducting layer 12, and a front insulating plastics layer 13. A conventional electrical component is indicated at 14 attached to the panel shown as merely one example.

The steel plate 10 provides structural strength for the panel and also can act as a cooling plate to allow the release of heat generated in conduction of electricity through the layer 12.

In manufacture of the panel, the layer 12 is designed generally using a computer technique to provide a required number of circuit paths or electrically conductive paths one of which is indicated at 15 and another of which is indicated at 16. The paths provide a required electrical connection between various components with the arrangements of the path designed so the components can be mounted upon the panel and the required electrical connection provided therebetween. The layer 12 is generated by laser cutting from a flat sheet of a suitable metallic material preferably copper. In one example the copper sheet is of the order of ⅛ inch thick and is cut to form circuit paths again of approximately ⅛ inch in width thus providing sufficient conductive material to accomodate a relatively high voltage and correspondingly high current, the voltage exceeding 100 volts and in some cases reaching 600 volts. Currents can accordingly vary from relatively low currents up to 100 amps. Where required, the width of a circuit path can be increased as indicated at 16A in FIG. 1 so as to provide an increased amount of conducted material to accomodate the increased current. The laser cutting technique can be arranged to remove the unwanted material which will of course be minimized by suitable computer aided design.

The layer 11 of a suitable plastic insulating material can be formed by laser cutting a sheet of the material using the same pattern as that forming the layer 12 so that the layer 12 can be laid into place into recesses formed in the sheet 11. The sheet 13 can therefore have a flat inner face which is then bonded to the flat outer face defined by the layers 12 and 11 so that the conductive layer 12 is fully encased or embedded within the insulating plastics material.

In an alternative arrangement (not shown) recesses can be formed in both the layers 13 and 11 so that the layer 12 is recessed into both layers. Any yet further alternative arrangements, an encasing material is injection molded around the layer 12 thus forming simultaneously the layers 11 and 13 which embed the conductive layer 12 and ensure that it is fully enclosed.

On the conductive path 15 is provided a plurality of electrical connection points indicated at 17. Each of these electrical connection points is formed as a circular portion of diameter approximately twice that of the width of the circuit path itself. After embedding of the layer 12 within the insulating material, holes are drilled from the front surface of the layer 13 through the layer 13 and into the layer 12 as indicated at 18. The holes are then tapped to form a female screw thread which can cooperate with a male screw threaded connector indicated at 19 in FIG. 1. The connector 19 provides electrical connection from the component 14 to the conductive path 15 at the connecting point 17.

As shown in FIG. 1, the component 14 is specifically designed so that its electrical connection can be made directly from an undersurface thereof through into the layer 12. In other cases where the component 14 is not specifically designed for the new system, it may be necessary to provide a tag type connector attached to the layer 12 and projecting outwardly from the layer 13 for attachment to the conventional wires of the element 14. In addition the screw type connection provided within the hole 18 can be replaced by a snap fastening arrangement in which the connector pin 19 is inserted and snapped into place by suitable shaping of the cooperating parts.

At the same time as the pattern for the layer 12 is designed, mechanical connecting points are also included in the pattern which bypass or miss the conductive paths 15, 16 etc.. Two of the points are indicated schematically at 20. At each of these points a hole is drilled from the front face of the layer 13 through to the steel backing plate 10. The hole is then tapped to define a screw thread on the inner surface for attachment of a threaded fastener 21 from the element 14 through the layers for structural support by the plate 10.

The panel therefore provides both structural support for the electrical components and addition provides a layer giving circuit paths for connection of the components each to the others as required. The amount of conductive material can be provided to give sufficient electrically conductive capacity. It will be appreciated therefore that the single panel can support a large number of electrical components which can be simply attached into the machine without the necessity for extensive wiring harnesses. Of course some wiring will be required to connect from the panel to other pieces of equipment for example motors.

Figure 3:
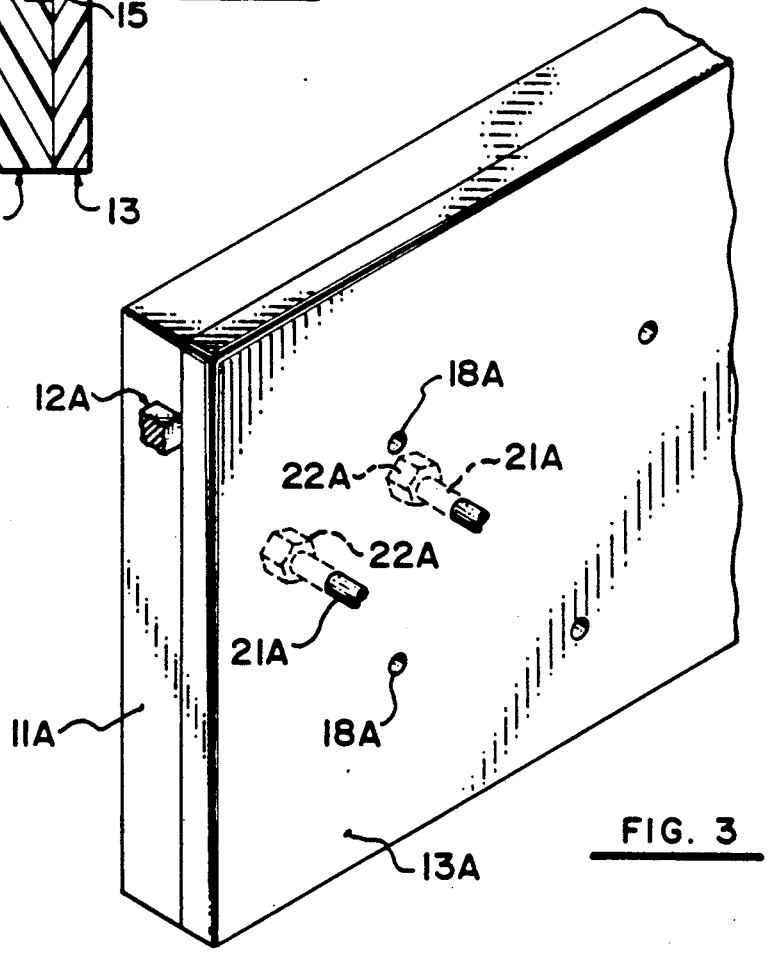
FIG. 3 is an isometric view of a panel similar to that of FIG. 2 but slightly modified according to an alternative of the invention.

In FIG. 3 there is shown an alternative arrangement in which the steel plate 10 is omitted and the structural strength is provided by the plastics layers 11A and 13A. In this case nuts 22A are cast or molded into the layer 11A to receive the threaded fasteners 21A. Such an arrangement can be suitable where the weight of the components can be accomodated by the plastics structure, possibly reinforced by struts bolted to the rear face of the layer 11.

Connections to the layer 12A can be made by forming a portion of the layer 12A into a tag connector to which wires can be directly attached. In this case the portion of the layer can in some cases be turned at right angles so that it projects forwardly through the layer 13A. Direct connection can then be made to the connecting portion projecting through the layer. In other cases, conventional terminal blocks can be attached to the device as described above.

In situations where the circuitry is highly complex, it may be necessary to form the device with a plurality of the layers 12 each separated from the next by a plastics layer with connections from one conducting layer to the next provided by the connectors 17 and the screws 19 as previously described.

In place of the injection molding technique previously mentioned, a vacuum forming technique can also be accepted in which case it is not necessary to cut any shape into the plastic layer since the vacuum forming technique will automatically shape it around the conducting layer and will bond it to the flat underlayer from the other side of the sandwich.

Since various modifications can be made in my invention as hereinabove described, and many apparently widely different embodiments of same made within the spirit and scope of the claims without departing from such spirit and scope, it is intended that all matter contained in the accompanying specification shall be interpreted as illustrative only and not in a limiting sense.

I claim:

1. An electrical panel for physically supporting and supplying electrical connections for a plurality of electrical components comprising a layer of a conductive material formed into a plurality of conductive paths having a thickness of conductive materials to accommodate voltage greater than 100 volts, a first layer of a non-conductive material covering a forward side of said conductive layer, a second layer of a non-conductive material covering a rearward side of said conductive layer, at least one of said first and second layers having recess means formed therein shaped to follow the shape of the conductive paths of the conductive layer so that the conductive layer is received in said recess means and is fully enclosed and sandwiched between said first and second layers, means providing structural strength for said panel sufficient to support said panel and said components attached thereto, a first plurality of holes formed in said first layer of non-conductive material communicating with electrical connecting points on said conductive paths of said conductive layer for allowing electrical connection thereto and a second plurality of holes formed in said first layer of non-conductive material separate from said first holes communicating with positions on said panel spaced from said conductive paths to provide mechanical connection of said components to said panel.

2. The electrical panel according to claim 1 wherein said conductive paths have sufficient conductive material to accommodate voltages greater than 100 V.

3. The electrical panel according to claim 1 wherein the conductive paths are formed of different widths to accommodate different current flow.

4. The electrical panel according to claim 1 wherein the first and second non-conductive materials are formed by molding onto said layer.

5. The electrical panel according to claim 1 wherein the layer is formed by cutting the conductive paths from a sheet of a metallic material, the cutting being carried out by laser.

6. The electrical panel according to claim 1 wherein said means providing structural strength comprises a backing plate attached to an outer surface of said second non-conductive layer and wherein said second plurality of holes extends through said first and second non-conductive materials and into said backing plate.

7. The electrical panel according to claim 1 wherein said layer of conductive material is formed by cutting from a sheet of conductive material.

8. The electrical panel according to claim 7 wherein the sheet is of substantially constant thickness.

9. The electrical panel according to claim 1 wherein said first plurality of holes are screw threaded and wherein there is provided a plurality of screws each for engaging into a respective one of the holes for providing electrical connection between a component and the conductive path.

10. The electrical panel according to claim 9 wherein each of said conductive paths is of increased width at an electrical connection point to receive said hole therein.

11. A method of supporting and connecting electrical components comprising generating a pattern of electrical connection paths having electrical connection points thereon and mechanical connection points separate from the paths, forming a layer of a conductive material into said paths, the paths having a thickness of conductive material sufficient to accept a voltage at least 100 volts, forming a first and a second layer of a non-conductive material, defining recess means in at least one of said first and second layers shaped to follow shape of said paths, placing said paths between said first and second layers so as to be located in said recess means thus fully enclosing and embedding said conductive layer in a non-conductive material forming a front layer of said non-conductive material and a rear layer of said non-conductive material, forming a first plurality of holes in said front layer to connect with said electrical connection points, forming a second plurality of holes separate from said first holes in said front layer to connect with said mechanical connecting points between said electrical connection paths, providing structural strength for said panels sufficient such that said mechanical connecting points support said components and mounting said electrical components on the panel such that the mechanical connecting points provide mechanical support therefor and such that said electrical connection points provide electrical connection therewith.

12. A method according to claim 11 wherein said conductive paths have sufficient conductive material to accomodate voltages greater than 100 V.

13. A method according to claim 11 wherein the conductive paths are formed of different widths to accomodate different current flow.

14. A method according to claim 11 wherein the first and second non-conductive materials are formed by molding onto said layer.

15. A method according to claim 11 wherein the layer is formed by cutting the conductive paths from a sheet of a metallic material, the cutting being carried out by laser.

16. A method according to claim 11 wherein said means providing structural strength comprises a backing plate attached to an outer surface of said second non-conductive layer and wherein said second plurality of holes extends through said first and second non-conductive materials and into said backing plate.

17. A method according to claim 11 wherein said layer of conductive material is formed by cutting from a sheet of conductive material.

18. A method according to claim 17 wherein the sheet is of substantially constant thickness.

19. A method according to claim 11 wherein said first plurality of holes are screw threaded and wherein there is provided a plurality of screws each for engaging into a respective one of the holes for providing electrical connection between a component and the conductive path.

20. A method according to claim 19 wherein each of said conductive paths is of increased width at an electrical connection point to receive said hole therein.

* * * * *